(12) United States Patent
Zhang et al.

(10) Patent No.: US 11,982,017 B2
(45) Date of Patent: May 14, 2024

(54) TRANSPARENT CONDUCTIVE OXIDE THIN FILM AND USE THEREOF

(71) Applicant: NINGBO INSTITUTE OF MATERIALS TECHNOLOGY AND ENGINEERING, CHINESE ACADEMY OF SCIENCES, Ningbo (CN)

(72) Inventors: Ruyi Zhang, Ningbo (CN); Yanwei Cao, Ningbo (CN); Yang Song, Ningbo (CN); Shaoqin Peng, Ningbo (CN); Jiachang Bi, Ningbo (CN)

(73) Assignee: NINGBO INSTITUTE OF MATERIALS TECHNOLOGY AND ENGINEERING, CHINESE ACADEMY OF SCIENCES, Ningbo (CN)

( * ) Notice: Subject to any disclaimer, the term of this patent is extended or adjusted under 35 U.S.C. 154(b) by 10 days.

(21) Appl. No.: 18/037,565

(22) PCT Filed: Jun. 11, 2021

(86) PCT No.: PCT/CN2021/099601
§ 371 (c)(1),
(2) Date: May 18, 2023

(87) PCT Pub. No.: WO2022/105203
PCT Pub. Date: May 27, 2022

(65) Prior Publication Data
US 2024/0003051 A1    Jan. 4, 2024

(30) Foreign Application Priority Data

Nov. 19, 2020   (CN) .......................... 202011297238.7

(51) Int. Cl.
C23C 14/08 (2006.01)
C30B 23/02 (2006.01)
(Continued)

(52) U.S. Cl.
CPC .............. C30B 29/22 (2013.01); C23C 14/08 (2013.01); C23C 14/082 (2013.01);
(Continued)

(58) Field of Classification Search
CPC .............. H01J 37/3405; H01J 37/3426; H01J 2237/332; C30B 29/22; C30B 23/025;
(Continued)

(56) References Cited

FOREIGN PATENT DOCUMENTS

| CN | 112695380 A | 4/2021 |
|----|-------------|--------|
| KR | 101337297 B1 | 12/2013 |
| WO | 2019124743 A1 | 6/2019 |

OTHER PUBLICATIONS

Luo et al. "Rectifying behavior and photoinduced characteristic in La-doped BaSnO3/p—Si heterojunctions, Phys. Status Solidi A" 211, No. 3, 705-708 (2014). (Year: 2014).*

(Continued)

*Primary Examiner* — Rodney G McDonald
(74) *Attorney, Agent, or Firm* — Bayramoglu Law Offices LLC

(57) ABSTRACT

A method for fabricating a transparent conductive oxide thin film, the method comprising the following steps: fabricating $Ba_{1-x}La_xSnO_3$ using a solid-phase reaction method to obtain a BLSO magnetron sputtering target material; and fabricating a BLSO thin film by means of direct deposition with argon as a sputtering gas by using a $SrTiO_3$, MgO, $LaAlO_3$, (La,Sr)(Al,Ta)$O_3$(LSAT), $MgAl_2O_4$ or $Al_2O_3$ single crystal substrate and the BLSO magnetron sputtering target material, such that the transparent conductive oxide thin film is fabricate is provided. During sputtering, the temperature of (Continued)

the substrate is 750° C.-950° C., and the deposition pressure of the Ar gas is 25-77 Pa. The room-temperature mobility of the transparent conductive oxide thin film can reach 115 cm$^2$/V·s, the room-temperature carrier concentration can reach $1.2 \times 10^{21}$ cm$^{-3}$, and the room-temperature conductivity can reach 14,000 S/cm.

5 Claims, 6 Drawing Sheets

(51) Int. Cl.
  *C30B 23/06*    (2006.01)
  *C30B 29/22*    (2006.01)
  *H01J 37/34*    (2006.01)
(52) U.S. Cl.
  CPC .......... *C23C 14/086* (2013.01); *C30B 23/025* (2013.01); *C30B 23/063* (2013.01); *H01J 37/3405* (2013.01); *H01J 37/3426* (2013.01); *H01J 2237/332* (2013.01)

(58) Field of Classification Search
CPC ..... C30B 23/063; C23C 14/08; C23C 14/082; C23C 14/086
USPC ..................................................... 204/192.29
See application file for complete search history.

(56) References Cited

OTHER PUBLICATIONS

Fei Xiao, et al., Electrical and optical behaviors of La-doped BaSnO3 thin film, Acta Physica Sinica, 2015, pp. 207303 (1-5), vol. 64, No. 20.

Alok Tiwari, et al., Role of oxygen partial pressure on structure and properties of sputtered transparent conducting films of La-doped BaSnO3, Thin Solid Films, 2020, pp. 1-8, vol. 703, 137986.

Yufeng Zhang, et al., Structure and Properties of Radio-frequency Magnetron Sputtered La Doped BaSnO3 Thin Films on 7059 Glass, IEEE, 2018, pp. 0873-0876.

* cited by examiner

TRANSPARENT CONDUCTIVE OXIDE THIN FILM AND USE THEREOF

CROSS REFERENCE TO RELATED APPLICATIONS

This application is the national stage entry of International Application No. PCT/CN2021/099601 filed Jun. 11, 2021, and which is based upon and claims priority to Chinese Patent Application No. 202011297238.7 filed Nov. 19, 2020, the entire contents of which are incorporated by reference herein.

TECHNICAL FIELD

The present disclosure relates to the synthesis of transparent conductive oxide thin films, particularly to a room-temperature high-mobility transparent conductive thin film as well as a fabrication method and application thereof.

BACKGROUND

A new transparent conductive oxide thin film is widely applied to the fields of transparent display devices, light-emitting devices, touch screens, photovoltaic cells, transparent logic devices and the like. At present, the widely used indium tin oxide (ITO) transparent conductive thin film has the disadvantages of high raw material cost (indium is a very rare precious metal) and instable chemical property, which needs to develop new transparent conductive oxide thin films including $Ba_{1-x}La_xSnO_3$. $BaSnO_3$ (BSO) is a transparent dielectric material, and is also a wide bandgap semiconductor material. Replacement of a few of $Ba^{2+}$ cations with $La^{3+}$ cations can maintain the high transparency of the thin film in a visible light range while realizing n type doping. The $Ba_{1-x}La_xSnO_3$ single crystal thin film has excellent chemical and thermal stabilities, and the room-temperature carrier mobility can reach 183 $cm^2/V \cdot s$ (the concentration of the carrier concentration is $8 \times 10^{19}$ $cm^{-3}$). However, the achievement of the above-mentioned room-temperature high-mobility requires: (1) to rely on expensive deposition equipment such as molecular beam epitaxy (MBE) and pulsed laser deposition (PLD); (2) to use a thick $BaSnO_3$ insulating buffer layer or a special annealing processing technology. The above method has the shortages of high cost, high technical threshold and complicated preparation process, and therefore it is necessary to develop a method for direct, economic and large-scale preparation of such the new transparent conductive oxide thin films, and a new transparent conductive device based on this thin film.

SUMMARY

In view of the above problems, the present disclosure provides a method for fabricating a new transparent conductive oxide thin film, and an application thereof in a transparent conductive device.

A key to obtain a high-performance (high room temperature mobility) BLSO thin film is to effectively reduce the defect density (mainly dislocation density) in the thin film in the growth process of the thin film. The previous research found that growing a BSO buffer layer with a thickness of 200-500 nm or annealing at an anoxic atmosphere is beneficial to a reduction of dislocation density in the BLSO thin film, thereby improving the room-temperature carrier mobility. In addition, the room-temperature high mobility in the BLSO thin film also relies on a thin film fabrication method, generally, the quality of the thin film crystal obtained by a molecular beam epitaxial technique is better than that obtained by other technologies, thereby realizing the room-temperature carrier mobility of up to 183 $cm^2/V \cdot s$. However, the molecular beam epitaxial technique has the disadvantages of expensive equipment and raw material costs and complicated technology. A magnetron sputtering technology is a thin film fabrication technology that is suitable for large-scale production and low in cost, however, it is generally considered that a high-quality single crystal epitaxial thin film is difficultly obtained by using this technology, and there is little research that a BLSO transparent conductive thin film with high room-temperature mobility can be successfully prepared by using this method. The core of the present disclosure is to develop a method for directly fabricating a transparent conductive oxide thin film with high room-temperature mobility by using a magnetron sputtering technology, and this thin film can be applied to various types of transparent conductive devices.

The technical solution of the present disclosure is as follows: provided is a method for fabricating a new transparent conductive oxide thin film, comprising the following steps:

preparing a $Ba_{1-x}La_xSnO_3$ (BLSO) ultrapure (99.99%) 2-inch magnetron sputtering target material using a solid-phase reaction method; and directly depositing and preparing a BLSO thin film by means of a magnetron sputtering method with ultrapure argon (99.999%) as a sputtering gas by using a $SrTiO_3$, MgO, $LaAlO_3$, $(La,Sr)(Al,Ta)O_3$(LSAT), $MgAl_2O_4$ or $Al_2O_3$ (sapphire) single crystal substrate and the above BLSO magnetron sputtering target material, wherein in the sputtering method, the temperature of the substrate is 750° C.-950° C., and the deposition pressure of the Ar gas is 25-77 Pa, the thin film is a transparent conductive oxide epitaxial thin film.

Preferably, the doping amount x of La in the BLSO magnetron sputtering target material and the transparent conductive oxide thin film is between 1% and 10%.

Preferably, the single crystal substrate comprises any one of $SrTiO_3$, MgO, $LaAlO_3$, $(La,Sr)(Al,Ta)O_3$ (LSAT), $MgAl_2O_4$ and $Al_2O_3$ (sapphire).

Preferably, in the magnetron sputtering method, the pressure of argon is 25-77 Pa, and the sputtering frequency of a radio-frequency generator is 20 W-50 W.

Preferably, the thickness of the new transparent conductive oxide thin film is 5 nm-1000 nm.

The new transparent conductive thin film prepared in the present disclosure is mainly applied to transparent conductive devices.

The present disclosure has the beneficial effects: the room-temperature mobility of the transparent conductive oxide thin film prepared in the present disclosure can reach 115 $cm^2/V \cdot s$, the room-temperature carrier concentration can reach $1.2 \times 10^{21}$ $cm^{-3}$, and the room-temperature conductivity can reach 14,000 S/cm.

DETAILED DESCRIPTION OF THE EMBODIMENTS

Figure 1:
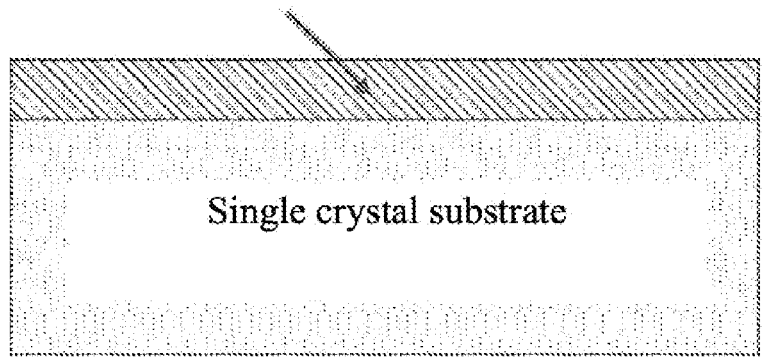
FIG. 1 is a structural diagram of a new transparent conductive oxide thin film according to the present application.

Next, the transparent conductive oxide thin film with high room-temperature as well as the direct fabrication method thereof and a transparent conductive device provided by the present disclosure will be further illustrated.

By long-term and deep research, the inventor found that the sputtering growth of BLSO thin film at an anoxic atmosphere is more beneficial for reducing the dislocation density and improving the room-temperature mobility of the thin film, and the visible range optical transparency of the thin film is not affected due to growth at the anoxic atmosphere.

To this end, a method for fabricating a transparent conductive oxide thin film with a high room-temperature mobility provided by the present application comprises the following steps:

S1, batching $La_2O_3/SnO_2/BaCO_3$ ultrapure (99.99%) reactants according to a stoichiometric ratio, preparing a 2-inch ultrapure (99.99%) $Ba_{1-x}La_xSnO_3$ (x=1%-10%) magnetron sputtering target material through ball-milling, drying, calcination reaction, formation, sintering and other standard solid phase reaction processes, and then mounting the target material onto a target gun of a magnetron sputtering system;

S2, carrying out ultrasonic cleaning for 5 minutes-10 minutes to an oxide single crystal substrate with acetone and alcohol solution respectively to remove potential pollutants on the surface, and purging with a nitrogen gun, and subsequently mounting the substrate onto a sample holder.

S3, pumping the magnetron sputtering chamber to about $10^{-3}$ Torr by respectively utilizing a mechanical pump and a turbo pump, and raising the temperature of the sample holder to 750° C.-950° C. in advance, then setting the pure argon gas flow (99.999%) as 10-40 sccm so that the spurting pressure is maintained at 25-77 Pa, setting the power of a radio-frequency generator as 20-50 W, pre-sputtering the BLSO target material for 10 minutes, then opening the baffle of the sample holder to formally start the sputtering growth of the BLSO thin film.

In S3, raising the temperature of the sample holder to 750° C.-950° C. in advance is conducive to further removal of organic residues on the surface of the substrate so as to improve the surface cleanliness of the substrate and prepare for the growth of the thin film. Specifically, the heating time of the sample holder is kept in 15-30 minutes. In S3, the pre-sputtering of the BLSO target material is intended to remove gases adsorbed onto the surface of the BLSO target material and eliminate the adverse influence on the growth of the thin film caused by initial instable sputtering.

Considering specific applications, the oxide substrate is preferably one of $SrTiO_3$ (STO), MgO (MGO), $LaAlO_3$ (LAO), $(La,Sr)(Al,Ta)O_3$(LSAT), $MgAl_2O_4$ and $Al_2O_3$ (sapphire).

The inventor finds that the temperature of the substrate, the pressure of argon and the power of the radio-frequency generator significantly affect the epitaxial growth, dislocation density and room-temperature mobility of the thin film.

To improve the quality of the BLSO thin film single crystal, reduce the dislocation density and improve the room-temperature mobility, the temperature of the substrate is preferably 800-900° C.

Further, the preferred deposition pressure for argon gas is in a range of 40-60 Pa, the deposition pressure of the Ar gas is adjusted by the flow of argon gas. In the range of 40-60 Pa, the BLSO thin film has a moderate growth rate, and is suitable for high-quality epitaxial growth of single crystals. It is noted that pure argon sputtering provides a relatively anoxic atmosphere for the growth of the BLSO thin film, which is beneficial to reducing the dislocation density while the BLSO thin film still maintains good visible range optical transparency.

Further preferably, the radio frequency power range is 40-45 W. At this power atmosphere, the BLSO target material has a moderate sputtering rate, and can sufficiently ensure the high-quality epitaxial growth of single crystals and reduce the dislocation density.

Controlling the sputtering time can allow the thickness of the BLSO thin film to be in a range of 5-500 nm, in which the thin film has good transparent conductivity.

The adjustment of the sputtering power, deposition pressure and time can control the thickness of the thin film to be in a range of 5 nm-1000 nm in which the thin films are all transparent conductive thin film.

In this method, deep exploration and optimization are made to the key growth parameters (the temperature of the substrate, the deposition pressure of the Ar gas and the power of the radio-frequency generator) of the BLSO thin film, so as to achieve the purposes of reducing the dislocation density and improving the room-temperature mobility. Therefore, this method has the advantages of direct deposition, controllable process and large-scale preparation, and is suitable for developing large-size transparent conductive oxide thin film with high room-temperature mobility.

The present disclosure further provides a transparent conductive device, including the transparent conductive thin film with high room-temperature mobility.

Specifically, the transparent conductive device includes a transparent display, a light-emitting device, a touch screen, a photovoltaic cell, a transparent logic device, and the like.

It can be understood that the transparent conductive device includes other necessary compositions and structures besides the transparent conductive thin film with high room-temperature mobility.

Next, the method for fabricating the new transparent conductive oxide thin film and device use thereof will be further illustrated through specific examples.

Example 1

A $Ba_{0.096}La_{0.04}SnO_3$ (x=0.04) target material and a $SrTiO_3$ (STO) single crystal substrate were selected to prepare a BLSO transparent conductive thin film with a thickness of 200 nm.

An STO substrate was subjected to ultrasonic cleaning for 5 minutes using analytical pure acetone and alcohol solution in sequence, and purging with a nitrogen gun.

The washed substrate was loaded onto a sample holder in a sputtering chamber and pumped until the vacuum degree reached 1*10-3 Torr, the generator of the sample holder was turned on, the temperature was set as 800° C., and then the substrate was baked for 15 minutes.

Figure 2:
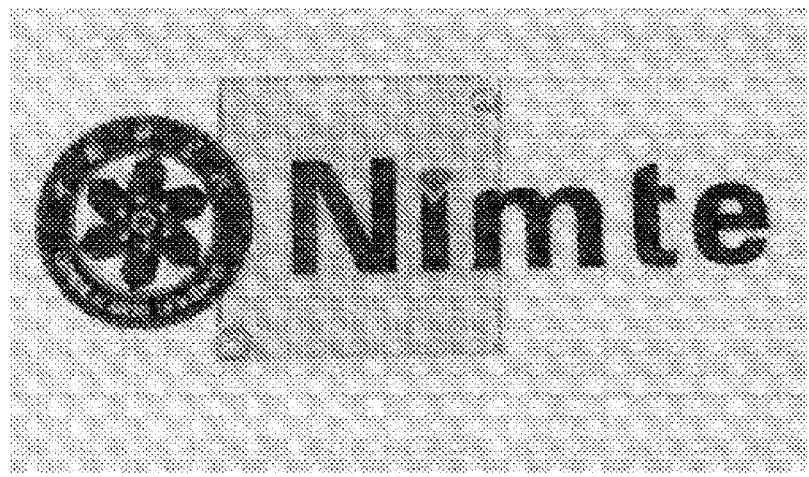
FIG. 2 is a photo image of a new transparent conductive oxide thin film prepared according to example 1 of the present application.
Figure 3:
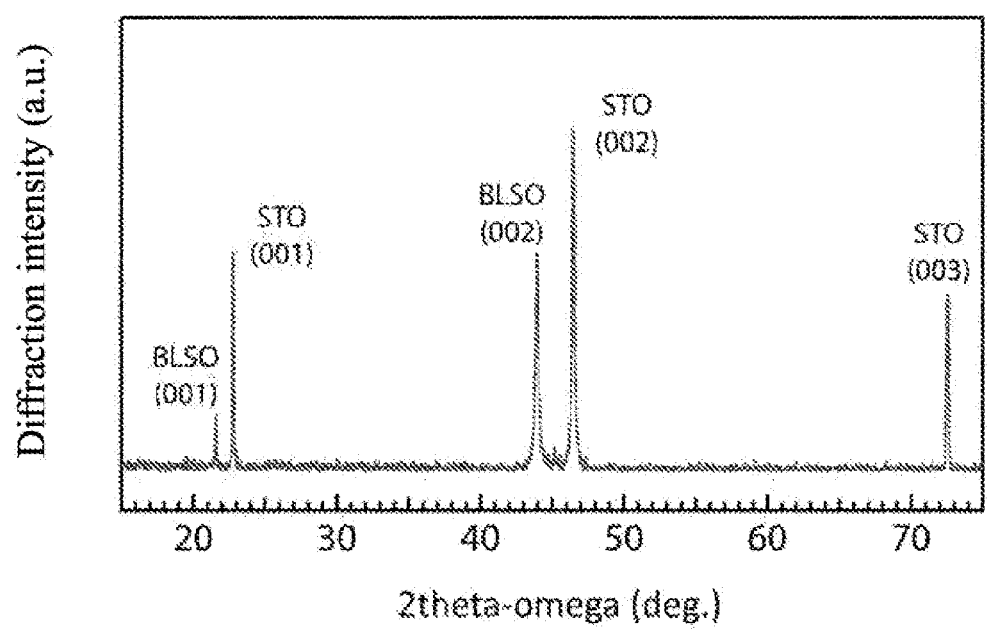
FIG. 3 is a XRD characterization of a new transparent conductive oxide thin film prepared according to example 1 of the present application.

The flow of ultrapure argon was controlled at 18 sccm, the deposition pressure of nitrogen was maintained at 50 Pa, and the temperature of the sample holder was maintained at 800° C. Then the radio-frequency generator of a BLSO target gun was turned on, the sputtering power was set at 40 W, and the pre-sputtering time was set as 10 minutes. A working distance between the target gun and the sample holder was adjusted as 10 cm. After sputtering for about 4 hours, and the thickness of the thin film was measured as about 200 nm with an ellipsometer. This thin film has good visible light transmission property (shown in FIG. 2).

Figure 4:
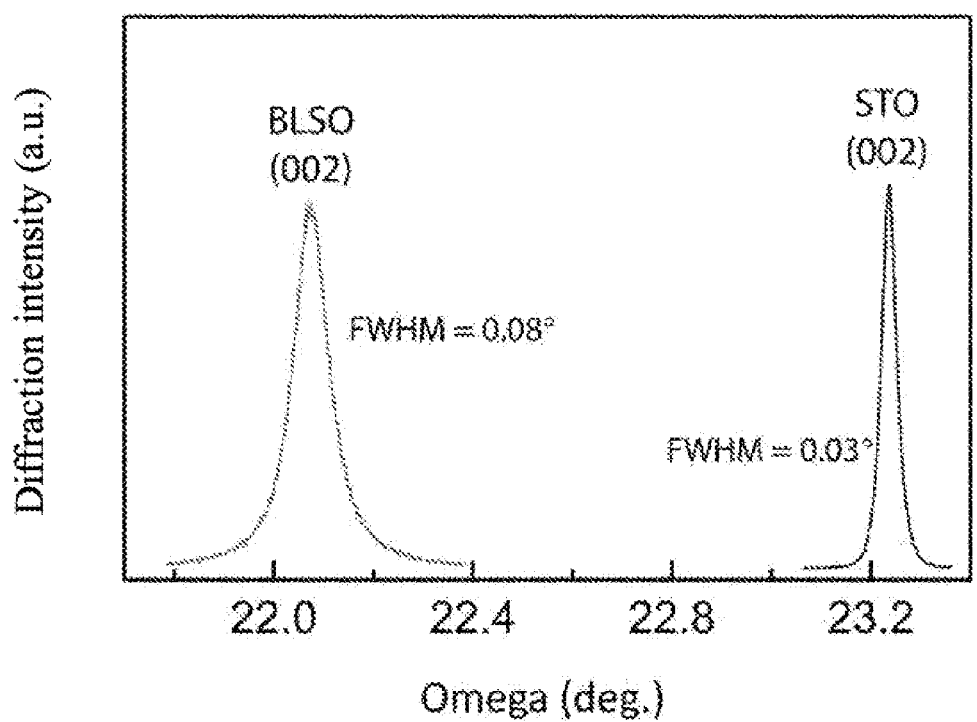
FIG. 4 is a crystal quality characterized by rocking curve of a new transparent conductive oxide thin film prepared according to example 1 of the present application.

Further, the above thin film was subjected to microstructure characterizations. It can be seen from high-resolution X-ray diffraction (HRXRD) 2theta-omega scanning that the BLSO thin film grows preferentially along the (001) direction, and there are no other impurity phases. It can be seen from FIG. 4, where rocking curves were recorded for the thin film and the substrate, respectively, that the full width at half maximum (FWHM) of the rocking curve of the BLSO thin film is only higher than that of the STO single crystal substrate by 2.5 times. Considering that the BLSO and STO substrates have about 5% of large lattice mismatch, it is inevitable for the epitaxial growth of the BLSO thin film to create a certain dislocation density. However, the FWHM of the rocking curve of the BLSO thin film is wider than that of the substrate by 2.5 times, indicating that BLSO has extremely high crystalline-quality.

Figure 5A:
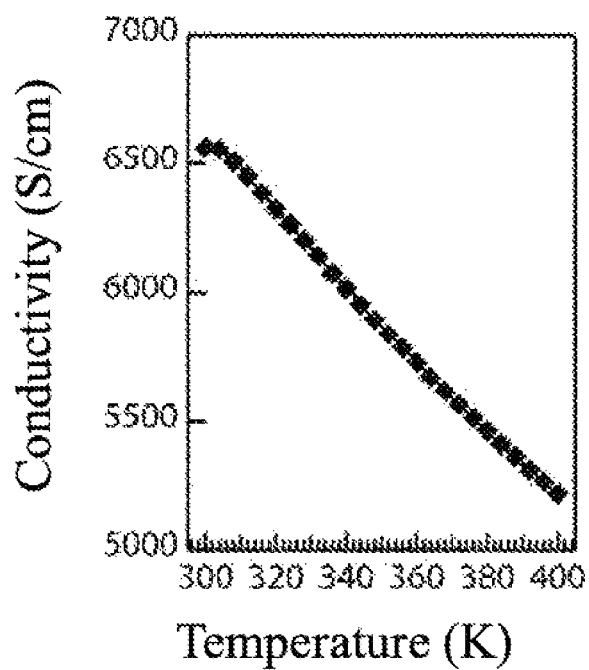
FIGS. 5A-5B are electrical transport measurements of a new transparent conductive oxide thin film prepared according to example 1 of the present application.
Figure 5B:
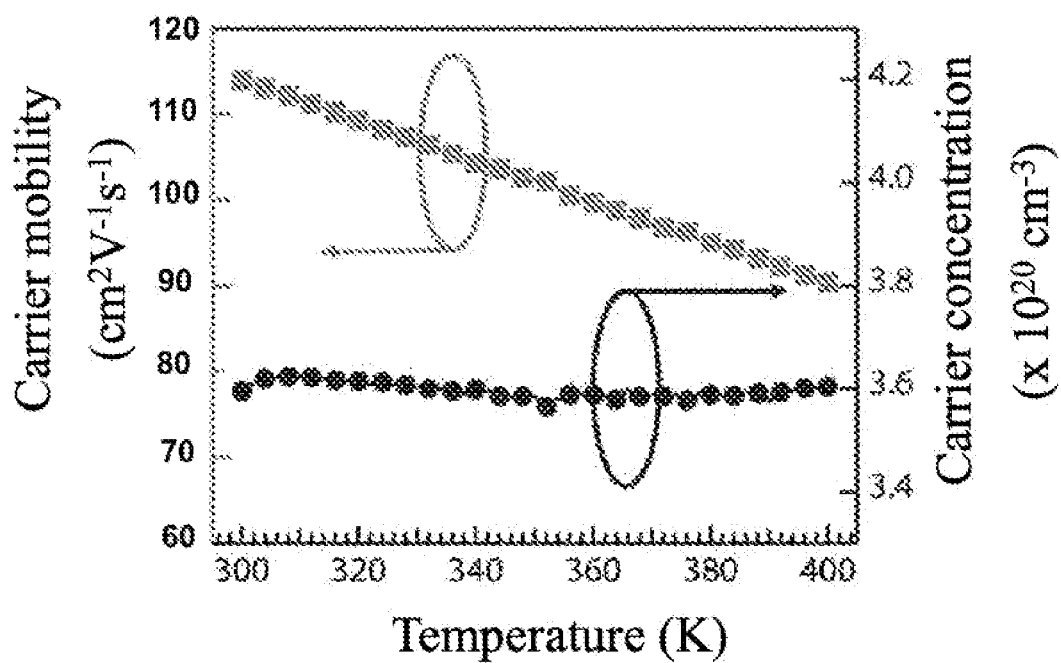

Next, electrical transport properties of the new transparent conductive oxide thin film was measured by utilizing a variable temperature hall effect measurement system. As shown in FIG. 5, the conductivity of the thin film decreases monotonically with temperature, showing good metallicity. Furthermore, the room-temperature conductivity can reach 6600 S/cm. The room-temperature carrier mobility can reach 115 cm$^2$/V·s, the carrier concentration is about $3.6 \times 10^{-20}$ cm$^{-3}$. The STO (001) single crystal substrate is replaced with STO (110) substrate, and the carrier concentration can be further improved to $4.6 \times 10^{-20}$ cm$^{-3}$, so that the room-temperature mobility is further improved to 8000 S/cm.

Example 2

A Ba$_{0.98}$La$_{0.02}$SnO$_3$ (x=0.02) target material and an MgO single crystal substrate were selected to prepare a BLSO transparent conductive thin film with a thickness of 500 nm.

An MgO substrate was subjected to ultrasonic cleaning for 5 minutes using analytical pure acetone and alcohol solution in sequence, and purging with a nitrogen gun.

The cleaned substrate was mounted onto a sample holder in a sputtering chamber and pumped until the vacuum reached $1*10^{-3}$ Torr, the generator of the sample holder was turned on, the temperature was set as 800° C., and then the substrate was heated for 15 minutes.

The flow of ultrapure argon was controlled at 6 sccm, the deposition pressure of nitrogen was maintained at 25 Pa, and the temperature of the sample holder was maintained at 800° C. Then the radio-frequency generator of a BLSO target gun was turned on, the sputtering power was set as 50 W, the pre-sputtering time was set as 10 minutes. A working distance between the target gun and the sample holder was adjusted as 15 cm. after sputtering for about 7 hours, and the thickness of the thin film was measured as about 500 nm with an ellipsometer. This thin film has good visible light transmission property (shown in FIG. 2).

It can be seen from high-resolution X-ray diffraction (XRD) that the BLSO thin film can epitaxially grow on an MgO substrate and has high crystalline quality, the electrical transport measurement proves that the BLSO thin film has a room-temperature carrier mobility of 82 cm$^2$/V·s, a room-temperature carrier concentration of $1.4 \times 10^{-20}$ cm$^{-3}$ and a room-temperature conductivity of 1830 S/cm.

Example 3

A Ba$_{0.92}$La$_{0.08}$SnO$_3$ (x=0.08) target material and an LAO single crystal substrate were selected to prepare a BLSO transparent conductive thin film with a thickness of 50 nm.

An LAO substrate was subjected to ultrasonic cleaning for 5 minutes using analytical pure acetone and alcohol solution in sequence, and purging with a nitrogen gun.

The washed substrate was loaded onto a sample holder in a sputtering chamber and pumped until the vacuum degree reached 1*10-3 Torr, the generator of the sample holder was turned on, the temperature was set as 850° C., and then the substrate was heated for 15 minutes.

The flow of ultrapure argon was controlled at 30 sccm, the deposition pressure of nitrogen was maintained at 77 Pa, and the temperature of the sample holder was maintained at 850° C. Then the radio-frequency generator of a BLSO target gun was turned on, and the sputtering power was set as 30 W, the pre-sputtering time was set as 10 minutes. A working distance between the target gun and the sample holder was adjusted as 10 cm. After sputtering for about 2 hours, and the thickness of the thin film was measured as about 50 nm with an ellipsometer. This thin film has good visible light transmission property (shown in FIG. 2).

It can be seen from high-resolution X-ray diffraction (XRD) that the BLSO thin film can epitaxially grow on the LAO substrate, and has (001) crystal orientation and high crystalline quality, the electrical transport measurement indicates that the BLSO thin film has room-temperature carrier mobility of 50 cm$^2$/V·s, room-temperature carrier concentration of $8.2 \times 10^{-20}$ cm$^{-3}$ and room-temperature conductivity of 6200 S/cm.

Comparative Example 1

Comparative example 1 differs from example 1 in that the temperature of the sample holder was 500° C.

When the temperature of the sample holder was 600° C., high-resolution X-ray diffraction shows that the BLSO thin film has (001) diffraction peak, but the crystalline-quality is extremely poor, resulting in poor thin film conductivity and the sheet resistance being on the megaohm order.

Comparative Example 2

Comparative example 2 differs from example 1 in that the deposition pressure of the Ar gas during sputtering was 1 Pa.

When the deposition pressure of the Ar gas was maintained at 1 Pa, high-resolution X-ray diffraction shows that although the BLSO thin film has (001) diffraction peaks, the crystalline-quality is extremely poor, resulting in poor thin film conductivity and the sheet resistance being on the megaohm order.

Comparative Example 3

Comparative example 3 differs from example 1 in that the power of a sputtering radio frequency source was 100 W.

When the power of a sputtering radio frequency source was 100 W, high-resolution X-ray diffraction shows that although the BLSO thin film has (001) diffraction peaks, the crystalline-quality is extremely poor, resulting in poor thin film conductivity and the sheet resistance being on the megaohm order.

The above examples are only for expressing several embodiments of the present disclosure, their descriptions are specific and detailed, but cannot whereby be understood as limiting the protective scope of the disclosure patent. It should be noted that several deformations and improvements can also be made by persons of ordinary skill in the art without the concept of the present disclosure, all of which are included within the protective scope of the present disclosure. Therefore, the protective scope of the present disclosure patent should be based on appended claims.

What is claimed is:

1. A method for fabricating a transparent conductive oxide thin film, comprising the following steps:
    fabricating $Ba_{1-x}La_xSnO_3$ (BLSO) using a solid-phase reaction method to obtain a BLSO magnetron sputtering target material; and
    fabricating a BLSO thin film by deposition with argon as a sputtering gas by using a $SrTiO_3$, MgO, $LaAlO_3$, $(La,Sr)(Al,Ta)O_3$(LSAT), $MgAl_2O_4$ or $Al_2O_3$ single crystal substrate and the BLSO magnetron sputtering target material, such that the transparent conductive oxide thin film is prepared; wherein the temperature of the substrate is 750° C.-950° C., and the deposition pressure of the Ar gas is 25-77 Pa while sputtering.

2. The method for fabricating the transparent conductive oxide thin film according to claim 1, wherein the doping amount x of La in the BLSO magnetron sputtering target material and the transparent conductive oxide thin film is between 1% and 10%.

3. The method for preparing the transparent conductive oxide thin film according to claim 1, wherein the single crystal substrate comprises any one of $SrTiO_3$, MgO, $LaAlO_3$, $(La,Sr)(Al,Ta)O_3$(LSAT), $MgAl_2O_4$ and $Al_2O_3$.

4. The method for fabricating the transparent conductive oxide thin film according to claim 1, wherein the thickness of the transparent conductive oxide thin film is between 5 nm-1000 nm.

5. The method for fabricating the transparent conductive oxide thin film according to claim 1, wherein the deposition pressure of the Ar gas is 25-77 Pa, and the sputtering power of a radio-frequency generator is 20 W-50 W while sputtering.

* * * * *